United States Patent
Nemoto

(10) Patent No.: US 6,584,380 B1
(45) Date of Patent: Jun. 24, 2003

(54) APPROXIMATE THIRD-ORDER FUNCTION GENERATOR, TEMPERATURE COMPENSATION QUARTZ OSCILLATION CIRCUIT MADE BY USING THE SAME, AND TEMPERATURE COMPENSATION METHOD

(75) Inventor: Kenji Nemoto, Sagamihara (JP)

(73) Assignee: Asahi Kasei Microsystems Co., Ltd., Tokyo (JP)

( * ) Notice: Subject to any disclaimer, the term of this patent is extended or adjusted under 35 U.S.C. 154(b) by 0 days.

(21) Appl. No.: 09/423,206

(22) PCT Filed: Jun. 1, 1998

(86) PCT No.: PCT/JP98/02410

§ 371 (c)(1),
(2), (4) Date: Nov. 3, 1999

(87) PCT Pub. No.: WO98/56105

PCT Pub. Date: Dec. 10, 1998

(30) Foreign Application Priority Data

Jun. 2, 1997 (JP) .............................................. 9-143963

(51) Int. Cl.[7] .............................................. G05D 23/00
(52) U.S. Cl. ....................................... 700/299; 331/158
(58) Field of Search ........................ 700/299; 361/158, 361/160, 176; 331/158

(56) References Cited

U.S. PATENT DOCUMENTS

| 4,020,426 A | * | 4/1977 | Helle | 331/158 |
| 4,051,446 A | * | 9/1977 | Owaki | 331/116 R |
| 4,254,382 A | * | 3/1981 | Keller et al. | 331/116 R |

(List continued on next page.)

FOREIGN PATENT DOCUMENTS

| DE | 30 08 686 | 9/1980 |
| DE | 2617737 C2 | 1/1986 |
| DE | 694 12 306 T2 | 12/1998 |
| JP | 04050613 A | * 2/1992 |
| JP | 04192905 A | * 7/1992 |
| JP | 8-116214 | 5/1996 |
| JP | 9-55624 | 2/1997 |
| JP | 10-4318 | 1/1998 |

OTHER PUBLICATIONS

F. Krummenacher et al., "A 4–MHz CMOS Continuous–Time Filter with On–Chip Automatic Tuning", IEEE Journal of Solid–State Circuits, vol. 23, No. 3, pp. 750–758, (1988).
R.E.J. Van DeGrift et al., "An 18–bit Video ADC Incorporating Folding and Interpolation Techniques", IEEE Journal of Solid–State Circuits, vol. SC–22, No. 6, pp. 944–953, (1987).
B. Nauta et al., "A 70–MS/s 110–mW 8–b CMOS Folding and Interpolating A/D Converter", IEEE Journal of Solid–State Circuits, vol. 30, No. 12, pp. 1302–1308, (1995).

*Primary Examiner*—Leo Picard
*Assistant Examiner*—Chad Rapp
(74) *Attorney, Agent, or Firm*—Finnegan, Henderson, Farabow, Garrett & Dunner, L.L.P.

(57) ABSTRACT

An approximate third-order function generator includes first, second, and third amplifiers, each receiving a common input signal and different fixed level signals. The three fixed level signals received respectively by the amplifiers sequentially increase in level. Each amplifier has an input-output characteristic whereby a non-inverted or inverted output signal is provided based on the common input signal and the fixed level signal. The fourth amplifier receives the same fixed level signal as the second amplifier and has an input-output characteristic in which a non-inverted or inverted output signal is provided based on the common input signal and the fixed level signal. The outputs of the first, third and fourth amplifiers have the same polarity, while that of the second amplifier is inverted. The output signals from the first, second, third and fourth amplifiers are added to generate a third-order function component free from the first-order component.

8 Claims, 11 Drawing Sheets

U.S. PATENT DOCUMENTS

| | | | |
|---|---|---|---|
| 4,560,959 A | | 12/1985 | Rokos et al. ................ 331/176 |
| 4,603,308 A | * | 7/1986 | Briefer ........................ 331/143 |
| 5,041,799 A | * | 8/1991 | Pirez ........................... 331/44 |
| 5,473,289 A | * | 12/1995 | Ishizaki et al. .............. 331/176 |
| 5,500,618 A | * | 3/1996 | Comer ........................ 327/361 |
| 5,648,741 A | | 7/1997 | Wichern ...................... 327/513 |
| 5,691,671 A | * | 11/1997 | Bushman ..................... 331/158 |

\* cited by examiner

APPROXIMATE THIRD-ORDER FUNCTION GENERATOR, TEMPERATURE COMPENSATION QUARTZ OSCILLATION CIRCUIT MADE BY USING THE SAME, AND TEMPERATURE COMPENSATION METHOD

TECHNICAL FIELD

The present invention relates to an approximate third-order function generator, for example, for use with a temperature compensated crystal oscillator, a temperature compensated crystal oscillation circuit made by using the function generator, and a temperature compensation method.

BACKGROUND ART

An example of an approximate third-order function generator of this type is the invention described, for example, on Japanese Patent Laid-Open No. 9-55624 which the present applicant proposed before.

This prior art discloses an approximate third-order curve generation circuit which comprises three differential amplifiers, each comprising a pair of MOS field effect transistors receiving a common first-order input signal and a fixed level signal, the respective fixed level signals to the three differential amplifiers being different in level, and providing a non-inverted output and an inverted output, and the non-inverted outputs and the inverted outputs from the three differential amplifiers being added respectively in group.

However, although the above prior art generator can generate an approximate third-order function, it cannot arbitrarily control its variable independently, which is a unsolved problem.

A general form of the third-order function is represented by:

$$f(x)=a_3x^3+a_2x^2+a_1x+a_0 \quad (1)$$

By transforming the variable in the expression (1), the expression (1) is rewritten as follows:

$$f(x)=a_3'(x-x_0)^3+a_1'(x-x_0)+a_0'$$

$$a_3=a_3'$$

$$a_2 3'x_0$$

$$a_1=3a_3'x_0^2+a_1'$$

$$a_0=a_0'-a_3x_0^3-a_1'x_0 \quad (2)$$

Since in the prior art the three differential amplifiers are used to generate an approximate third-order function, the output approximate third-order function is shown in FIG. 15, which is represented by the following expression (3).

This expression (3) contains a second term component of the expression (2) thereby and variables $a_3'$ and $a_1'$ in the expression (2) cannot be controlled independently, which is an unsolved problem.

$$f(x)=\alpha\{a_3''(x-x_0)^3+a_1''(x-x_0)\}+a'' \quad (3)$$

Especially, when the approximate third-order function generator is used for temperature compensation of an voltage-controlled crystal oscillation circuit, an approximate third-order function which compensates a temperature characteristics of the crystal oscillator is required to be generated, but an accurate temperature compensated crystal oscillation circuit cannot be constituted, which is an unsolved problem.

DISCLOSURE OF THE INVENTION

The present invention is made in view of those unsolved problems with the prior art. It is a first object of the present invention to provide an approximate third-order function generator capable of accurately outputting only a first term component of the expression (2) and controlling the respective variables independently.

A second object of the present invention is to provide a temperature compensated crystal oscillation circuit which uses an approximate third-order function generator to perform accurate temperature compensation.

A third object of the present invention. is to provide a method of performing temperature compensation for a temperature compensated crystal oscillation circuit.

In order to achieve the first object, an approximate third-order function generator of claim 1 comprises a first amplifier, a second amplifier and a third amplifier each receiving a common input signal and a different fixed level signal, the three different fixed level signals received respectively by the first, second and third amplifiers sequentially increasing in level in this order, each amplifier having an input-output characteristics in which a non-inverted or inverted output signal is provided based on the common input signal and the fixed level signal concerned, that amplifier also having a function to limit the output signal to within a range defined by a maximum predetermined value and a minimum predetermined value; a fourth amplifier receiving the common input signal and the same fixed level signal as the second amplifier receives, the fourth amplifier having an input-output characteristics in which a non-inverted or inverted output signal is provided based on the common input signal and the fixed level signal concerned, and having a function to limit the output signal to within a range defined by a maximum predetermined value and a minimum predetermined value; and a fixed level signal generation circuit for supplying the fixed level signals having the different fixed levels to the first, second, third, and fourth amplifiers, respectively, the output characteristics of the first, third and fourth amplifiers being set so as to have the same polarity, the output characteristics of the second amplifier being set so as to be reverse to those of the first, third and fourth amplifiers, wherein the output signals from the first, second, third and fourth amplifiers being added to generate a third-order function component free from a first-order component.

In the invention of claim 1, the second amplifier which has a characteristics reverse to those of the first, third and fourth amplifiers is provided, so that only a third-order component free from the first-order component as the first term of the expression (2) produced by the first, second and third amplifiers can be generated. Thus, the variables of the first and second terms of the expression (2) can be controlled independently.

An approximate third-order function generator of claim 2 comprises a third-order component generation unit which includes a third-order component generation circuit having the composition of claim 1 supplied with an input added voltage as a first-order input voltage which includes the sum of a first-order input voltage signal and a variable voltage signal, and a variable gain amplifier which receives an amplified version of the differential between the non-inverted and inverted output signals from the third-order component generation circuit; a first-order component generation unit for receiving the input added voltage and for generating a first-order component; a constant generation unit for receiving a constant voltage signal and for generating a constant component; and an addition circuit for adding output signals from the third-order component generation unit, the first-order generation unit, and the constant generation unit.

The invention of the claim 2 is constructed so as to comprise the third-order component generator, the first-order component generation unit and the constant generation unit which have the respective compositions described in claim 1 and their outputs are added. Thus, the third-order function of the expression (2) can be generated accurately and the respective variables can be controlled independently.

An approximate third-order function generator of claim 3 is characterized in that in the invention of claim 1 or 2, the fourth amplifier has an output characteristics reverse in inclination to the inverted output characteristics of the second amplifier, and the distance between the maximum and minimum values of the output signal is set so as to be longer than that of the second amplifier.

In the invention of claim 3, an approximate first-order straight line can be generated in a range of input voltages which can be approximated by a third-order function which has been generated by the first-third amplifiers to thereby ensure that the first-order component contained in the third-order component is offset.

An approximate third-order function generator of claim 4 is characterized in that the first-fourth amplifiers each comprise a differential amplifier having a pair of MOS field effect transistors.

In the invention of claim 4, the approximate third-order function generator includes CMOSs to thereby achieve higher density integration and reduced power consumption.

A temperature compensated crystal oscillation circuit of claim 5 is characterized by a temperature detection circuit, a temperature compensation circuit which includes an approximate third-order function generator according to any one of claims 1–4 for receiving a detection signal from the temperature detection circuit, and a voltage-controlled crystal oscillation circuit for receiving the approximate third-order function generated by the temperature compensation circuit.

In the invention of claim 5, an accurate third-order function which is free from first-order component contained in the third-order component is generated, as described above, in the approximate third-order function generator of the temperature compensation circuit. The temperature characteristics of the crystal oscillator in the voltage-controlled crystal oscillation circuit is compensated accurately.

A temperature compensation adjusting method for a temperature compensated crystal oscillation circuit of claim 6 comprises the steps of measuring an output voltage $V_{Cout}$ from a temperature compensation circuit in a predetermined temperature atmosphere; measuring an input voltage $V_{Cin}$ to the voltage-controlled crystal oscillation circuit where the oscillation frequency output from the voltage-controlled crystal oscillation circuit coincides with a preset selected frequency at a respective one of a plurality of temperatures T in a desired temperature compensation range; approximately representing the measured input voltage $V_{Cin}$ and output voltage $V_{Cout}$ at the respective temperature by:

$$V_{Cin}(T) = \alpha_3(T-T_0)^3 + \alpha_1(T-T_0) + \alpha_0$$

$$V_{Cout}(T) = \beta_3(T-T_0')^3 + \beta_1(T-T_0') + \beta_0;$$

and adjusting coefficients $\beta_0$, $\beta_1$, $\beta_3$ and $T_0'$ of the temperature compensation circuit so as to coincide with the coefficients $\alpha_0$, $\alpha_1$, $\alpha_3$ and $T_0$, respectively, inherent to a crystal resonator of the voltage-controlled crystal oscillation circuit.

In the invention of claim 6, the output voltage $V_{Cout}$ from the temperature compensation circuit and the input voltage $V_{Cin}$ to the voltage-controlled crystal oscillation circuit are measured at the respective one of the plurality of temperatures in the desired temperature compensation range, and approximated by the corresponding third-order function expressions each as a function of a temperature. The coefficients of the temperature compensation circuit are adjusted so as to coincide with coefficients dependent on the crystal resonator of the voltage-controlled oscillation circuit and hence the temperature compensation is achieved by a single temperature sweeping operation.

As described above, according to the invention of claim 1, the approximate third-order function generator comprises a first amplifier, a second amplifier and a third amplifier, each receiving a common input signal and a different fixed level signal, the three different fixed level signals received by the first, second and third amplifiers sequentially increasing in level in this order, each amplifier having an input-output characteristics in which a non-inverted or inverted output signal is provided based on the common input signal and the fixed level signal concerned, that amplifier also having a function to limit the output signal to within a range defined by a maximum predetermined value and a minimum predetermined value; a fourth amplifier receiving the common input signal and the same fixed level signal as the second amplifier receives, the fourth amplifier having an input-output characteristics in which a non-inverted or inverted output signal is provided based on the common input signal and the fixed level signal concerned, and having a function to limit the output signal to within a range defined by an maximum predetermined value and a minimum predetermined value; and a fixed level signal generation circuit for supplying the fixed level signals having the different fixed levels to the first-fourth amplifiers, respectively, the output characteristics of the first, third and fourth amplifiers being set so as to have the same polarity, the output characteristics of the second amplifier being set so as to be reverse to those of the first, third and fourth amplifiers, the output signals from the first, second, third and fourth amplifiers being added to generate a third-order function component free from a first-order component. Thus, only the third-order component free from the first-order component in the third-order function is output. Thus, the variables of the third-order function can be controlled independently.

According to the invention of claim 2, the approximate third-order function generator comprises a third-order component generation unit which includes a third-order component generation circuit having the composition of claim 1 supplied with an input added voltage as a first-order input voltage which includes the sum of a first-order input voltage signal and a variable voltage signal, and a variable gain amplifier which receives an amplified version of the differential between the non-inverted and inverted output signals from the third-order component generation circuit; a first-order component generation unit for receiving the input added voltage and for generating a first-order component; a constant generation unit for receiving a constant voltage signal and for generating a constant component; and an addition circuit for adding output signals from the third-order component generation unit, the first-order generation unit, and the constant generation unit. Thus, by controlling independently the respective variables of a third-order component, a first-order component and a constant component obtained when a general-form third-order function is converted with respect to its variables, any third-order function is realized as a voltage input and a voltage output.

According to the invention of claim 3, the fourth amplifier has an output characteristics reverse in inclination to the inverted output characteristics of the second amplifier, and the distance between the maximum and minimum values of the output signal is set so as to be longer than that of the second amplifier. Thus, an approximate first-order straight line can be generated in a range of input voltages which can be approximated by a third-order function which has been generated by the first-third amplifiers to thereby ensure that the first-order component contained in the third-order component is offset.

According to the invention of claim 4, the first-fourth amplifiers each comprise a differential amplifier having a pair of MOS field effect transistors. Thus, the whole approximate third-order function generator has a CMOS composition to thereby achieve higher density integration and reduced power consumption.

According to the invention of claim 5, the temperature compensated crystal oscillation circuit comprises a temperature detection circuit, a temperature compensation circuit which includes an approximate third-order function generator according to any one of claims 1–4 for receiving a detection signal from the temperature detection circuit, and a voltage-controlled crystal oscillation circuit for receiving the approximate third-order function generated by the temperature compensation circuit. Thus, an accurate third-order function which is free from first-order component contained in the third-order component is generated, as described above, in the approximate third-order function generator of the temperature compensation circuit. Thus, the temperature characteristics of the crystal oscillator in the voltage-controlled crystal oscillation circuit is compensated accurately.

According to the invention of claim 6, the output voltage $V_{Cout}$ from the temperature compensation circuit and the input voltage $V_{Cin}$ to the voltage-controlled crystal oscillation circuit are measured at the respective one of the plurality of temperatures in the desired temperature compensation range, and approximated by the corresponding third-order function expressions each as a function of a temperature. The coefficients of the temperature compensation circuit are then adjusted so as to coincide with coefficients dependent on the crystal resonator of the voltage-controlled crystal circuit and hence a high-accuracy temperature compensation is achieved by a single temperature sweeping operation.

Figure 1:
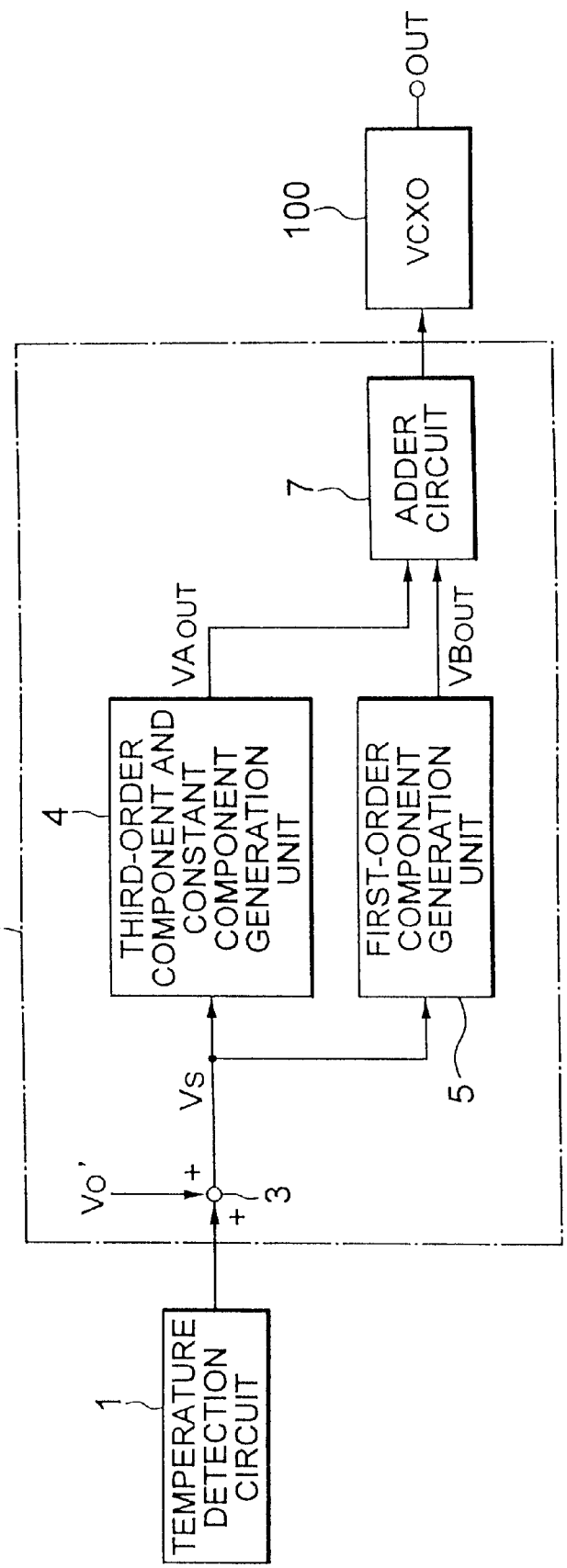
FIG. 1 is a block diagram of an embodiment of the present invention.

Description of the Reference Numerals: 1 . . . Temperature Detection Circuit; 2 . . . Approximate Third-Order Function Generator; 100 . . . Voltage-Controlled Crystal Oscillator; 3 . . . Adder; 4 . . . Third-Order Component and Constant Component Generation Unit; 5 . . . First-Order Component Generation Unit; 7 . . . Adder Circuit; 8 . . . Third-Order Component Generation Circuit; 11 . . . Differential Amplifier; 12 . . . Variable Gain Amplifier; 14 . . . Current Mirror Circuit; 15A–15D . . . Differential Amplifiers; $TrA_1$–$TrD_2$ . . . MOS Field Effect Transistors; 16A, 16B . . . Output Voltage Adding Resistors; 17 . . . Fixed Level Generation Circuit; 18 . . . Constant Voltage Generation Circuit; VR . . . Variable Resistor; 20 . . . Non-inverting Amplifier.

BEST MODE FOR CARRYING OUT THE INVENTION

An embodiment of the present invention will be described with reference to the drawings.

FIG. 1 is a block diagram of an embodiment of a temperature compensated crystal oscillator to which the present invention is applied.

In FIG. 1, reference numeral 1 denotes a temperature detection circuit whose analog output voltage changes linearly depending on its temperature change. A detected temperature value of an analog voltage outputted from the temperature detection circuit 1 is inputted as an input signal $V_{IN}$ to an approximate third-order function generator 2 to generate a control voltage to compensate the temperature characteristics of the crystal. The control voltage is then fed to a voltage-controlled crystal oscillator (VCXO) 100.

The temperature detection circuit 1 and the approximate third-order function generator 2 constitute a temperature compensation circuit. The approximate third-order function generator 2 generates the third-order function represented by the expression (2) and is comprised of an adder 3 which sums up the input signal $V_{IN}$ and variable voltage $V_0'$, a third-order component and constant component generation unit 4 which receives a summed-up output $V_S$ from the adder 3 and which generates a third-order component and constant component of the first term of the expression (2) based on the summed-up output $V_S$, a first-order component generation unit 5 which generates a first-order component of a second term of the expression (2), and an addition circuit 7 which sums up output signals from the third-order component generation unit 4 and the first-order component generation unit 5.

Figure 2:
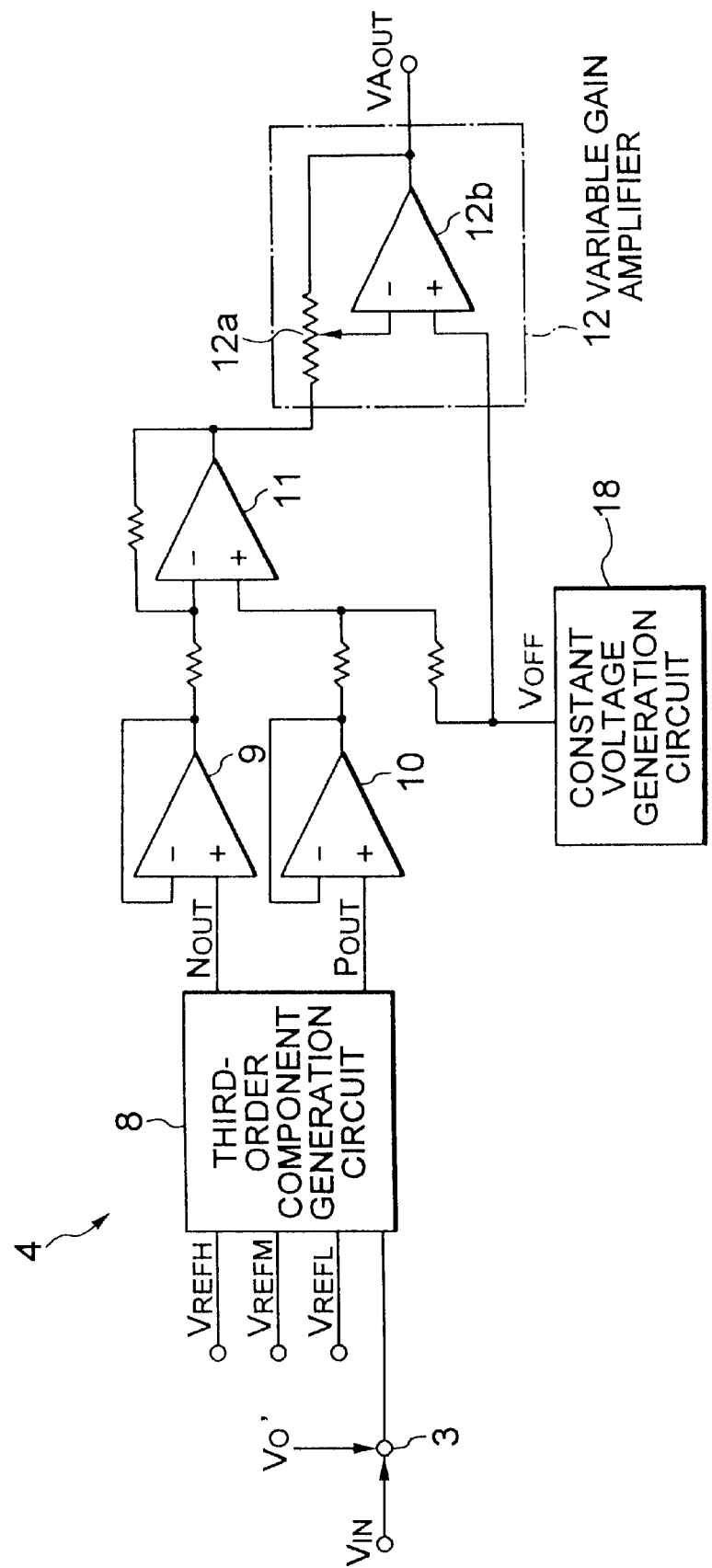
FIG. 2 is a circuit diagram of a third-order component and constant component generation unit of FIG. 1.

As shown in FIG. 2, the third-order component and constant component generation unit 4 is comprised of a third-order component generation circuit 8 as an approximate third-order function generator in the narrow sense which generates only a third-order component, a differential amplifier 11 which receives a non-inverted output signal $P_{OUT}$ and an inverted output signal $N_{OUT}$ via buffer circuits 9 and 10, respectively, and a variable gain amplifier 12 which receives an output from the differential amplifier 11.

Figure 3:
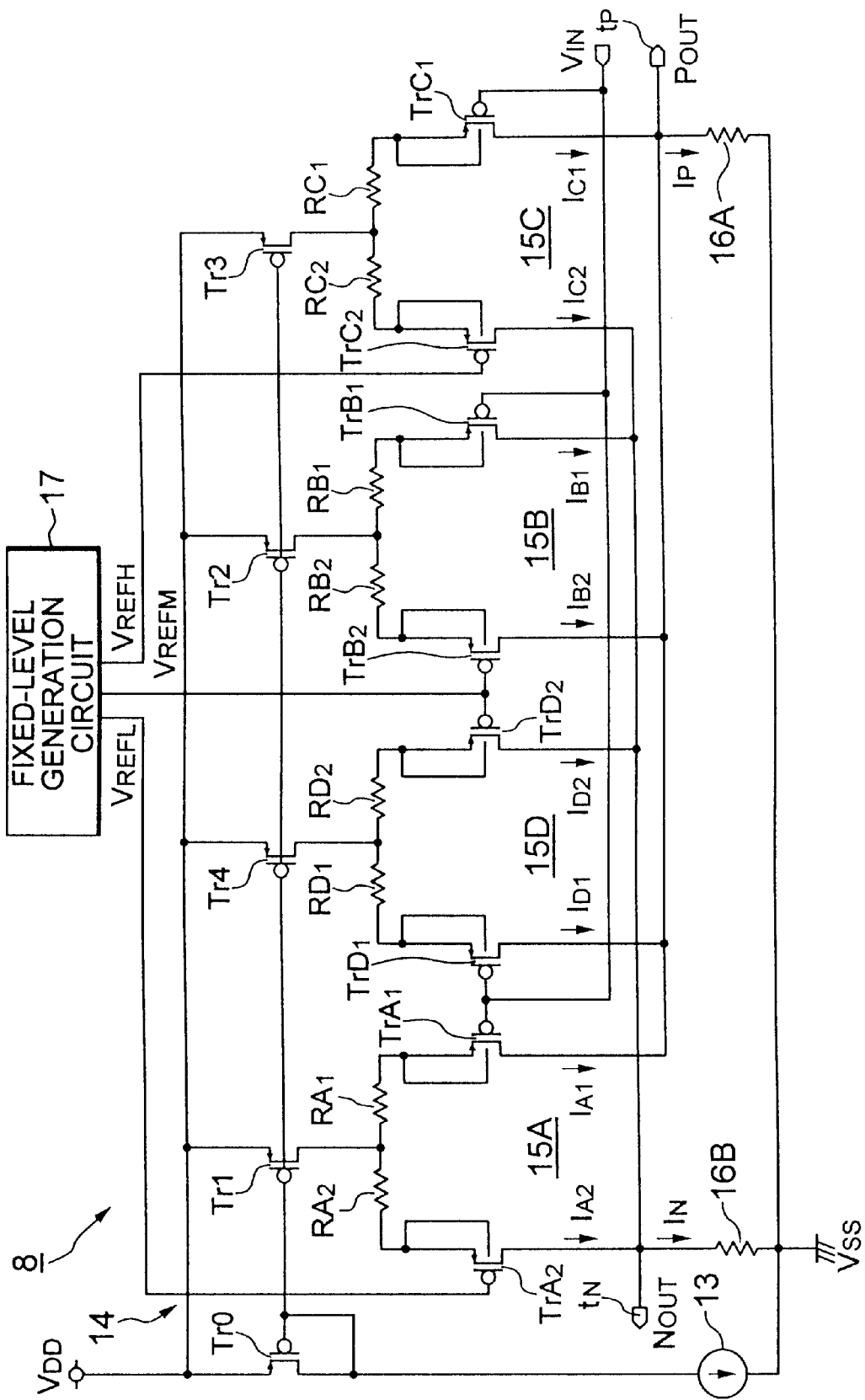
FIG. 3 is a circuit diagram of one example of the third-order component generation circuit of FIG. 2.

As shown in FIG. 3, the third-order component generation circuit 8 is comprised of a current mirror circuit 14 which includes a p-channel MOS field effect transistor Tr0 having a source connected to a positive power supply terminal $V_{DD}$, and a gate and a drain connected together and grounded via a constant current source 13, and four p-channel MOS field effect transistors Tr1–Tr4 having gates connected to the gate of the field effect transistor Tr0 and having the same size as the transistor Tr0; four differential amplifiers 15A–15D which constitute first-fourth amplifiers each supplied with a constant current from the current mirror circuit 14; resistors 16A and 16B having the same resistance value and each functioning as an adder which sums up output voltages from the differential amplifiers 15A–15D; and a fixed level generation circuit 17 composed of a fixed voltage generation circuit which supplies reference fixed voltages $V_{REFL}$, $V_{REFM}$ and $V_{REFH}$ different in level to the corresponding differential amplifiers 15A–15D.

The differential amplifier 15A includes p-channel MOS field effect transistors $TrA_1$ and $TrA_2$ connected in series via resistors $RA_1$ and $RA_2$ to the drain of the field effect transistor Tr1 of the current mirror circuit 14. An input signal $V_{IN}$ is supplied to the gate of the transistor TrA, and the reference fixed voltage $V_{REFL}$ is supplied from the fixed level generation circuit 17 to the gate of the transistor $TrA_2$. The drain of the transistor $TrA_1$ is grounded via the resistor 16A which constitutes the adder whereas the drain of the transistor $TrA_2$ is grounded via the other resistor 16B which constitutes the other adder.

Similarly, the differential amplifier 15B includes p-channel MOS field effect transistors $TrB_1$ and $TrB_2$ connected in series via resistors $RB_1$ and $RB_2$ to the drain of the field effect transistor Tr2 of the current mirror circuit 14. An input signal $V_{In}$ is supplied to the gate of the transistor $TrB_1$ and the reference fixed voltage $V_{REFM}$ is supplied from the fixed level generation circuit 17 to the gate of the transistor $TrB_2$. Unlike the case of the differential amplifier 15A, the drain of the transistor $TrB_1$ is grounded via the resistor 16B which constitutes the adder whereas the drain of the transistor $TrB_2$ is grounded via the other resistor 16A which constitutes the other adder. The inverted output characteristics of the differential amplifier 15B is set, for example, reverse to the differential amplifiers 15A, 15C and 15D.

Like the differential amplifier 15A, the differential amplifier 15C includes p-channel MOS field effect transistors $TrC_1$ and $TrC_2$ connected in series via resistors $RC_1$ and $RC_2$ to the drain of the field effect transistor Tr3 of the current mirror circuit 14. An input signal $V_{In}$ is supplied to the gate of the transistor $TrC_1$ and the reference fixed voltage $V_{REFH}$ is supplied from the fixed level generation circuit 17 to the gate of the transistor $TrC_2$. The drain of the transistor $TrC_1$ is grounded via the resistor 16A which constitute the adder whereas the drain of the transistor $TrC_2$ is grounded via the other resistor 16B which constitute the other adder.

Like the differential amplifiers 15A and 15C, the differential amplifier 15D includes p-channel MOS field effect transistors $TrD_1$ and $TrD_2$ connected in series via resistors $RD_1$ and $RD_2$ to the drain of the field effect transistor Tr4 of the current mirror circuit 14. An input signal $V_{In}$ is supplied to the gate of the transistor $TrD_1$ and the reference fixed voltage $V_{REFM}$ is supplied from the fixed level generation circuit 17 to the gate of the transistor $TrD_2$. Unlike the case of the differential amplifiers 15A–15C, the drain of the transistor $TrD_1$ is grounded via the resistor 16B which constitutes the adder whereas the drain of the transistor $TrD_2$ is grounded via the other resistor 16A which constitutes the other adder.

A non-inverted output terminal to is connected to the junction of the resistor 16A which constitutes the adder, and the field effect transistors $TrA_1$, $TrB_2$, $TrC_1$ and $TrD_1$. Similarly, an inverted output terminal $t_N$ is connected to the junction of the resistor 16, and the field effect transistors $TrA_2$, $TrB_1$, $TrC_2$ and $TrD_2$.

The respective levels of the reference fixed voltages $V_{REFH}$–$V_{REFL}$ generated by the fixed level generation circuit 17 and supplied to the respective differential amplifiers 15A–15C are set by $V_{REFL} < V_{REFM} < V_{REFH}$ so that the differential amplifier 15D is also supplied with the same reference fixed voltage $V_{REFM}$ as that supplied to the differential amplifier 15B.

As shown in FIG. 2, the non-inverted and inverted output signals $P_{OUT}$ and $N_{OUT}$ from the third-order component generation circuit 8 are supplied via the buffer circuits 9 and 10 to the non-inverted and inverted inputs, respectively, of a differential amplifier 1. An output signal from the differential amplifier 11 is supplied to an inverting input of an operational amplifier 12b via a variable resistor 12a intervening in a negative feedback circuit which constitutes a part of a variable gain amplifier 12. Any set offset voltage $V_{OFF}$ is supplied from a constant voltage generation circuit 18 to normal inputs to the operational amplifier 12b and the differential amplifier 11. Thus, the operational amplifier 12b provides an output $VA_{OUT}$ which contains only a third-order component free from a first-order component and a constant component, represented by:

$$VA_{OUT} = b_3(V_{In} - V_0)^3 + V_{OFF} \quad (5)$$

where $V_0 = V_{REFM} - V_0'$, and the variable $b_3$ is determined by the gains of the third-order component generation circuit 8 and the variable gain amplifier 12.

Figure 4:
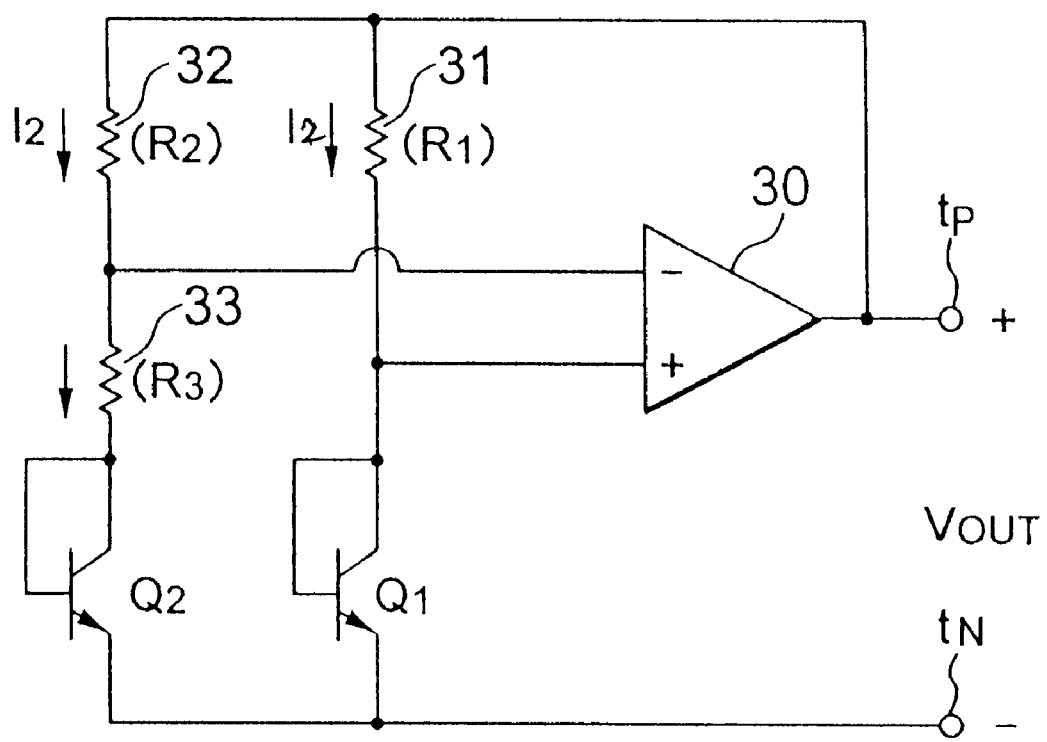
FIG. 4 is a circuit diagram of one example of a constant voltage generation circuit of FIG. 1.

As shown in FIG. 4, the constant voltage generation circuit 18 is comprised of an operational amplifier 30, a bipolar transistor $Q_1$ whose collector and base are connected together via a resistor 31 to the output of the operational amplifier 30 and whose emitter is connected to a negative output terminal $t_N$ of the operational amplifier 30 to form a diode connection, and a bipolar transistor $Q_2$ whose collector and base are connected together via resistors 32 and 33 to the output of the operational amplifier 30. A junction point of the resistors 32 and 33 is connected to the inverting input of the operational amplifier 30. A junction point of the resistor 31 and transistor $Q_1$ is connected to the non-inverting input of the operational amplifier 30 with a positive output terminal to being connected to the output of the operational amplifier 30 to thereby constitute a band gap reference voltage circuit.

In this band gap reference voltage circuit, a voltage differential $\Delta V_{BE}$ between the base-emitter voltages of the transistors $Q_2$ and $Q_1$ applied across the resistor 33 is represented by:

$$\Delta V_{BE} = V_T ln\{(I_1/I_2)(I_{S2}/I_{S1})\} = V_T ln\{(R_1/R_2)(I_{S2}/I_{S1})\} \quad (6)$$

where $V_T$ is a thermal voltage, $I_1$ is the value of a current flowing through the resistor 31, $I_2$ is the value of a current flowing through the resistor 32, $I_{S1}$ is a constant which represents a transmission characteristics of a forward active area of the transistor $Q_1$, $I_{S2}$ is a constant which represents a transmission characteristics of a forward active area of the transistor $Q_2$, $R_1$ is the resistance value of the resistor 31, and $R_2$ is the resistance value of the resistor 32.

Since the same current as flows through the resistor 33 flows through the resistor 32, a voltage drop $V_{R2}$ across the resistor 32 is represented by:

$$V_{R2}=(R_2/R_3)\Delta V_{BE}=(R_2/R_3)V_T ln\{(R_2/R_1)(I_{S2}/I_{S1})\} \quad (7)$$

As is obvious form the expression, (7), if the temperature coefficients of the resistors are zero, the currents $I_1$ and $I_2$ are together proportional to temperature, so that the output voltage $V_{OUT}$ across the output terminals $t_P$ and $t_N$ is represented by:

$$V_{OUT}=V_{BE1}+(R_2/R_3)V_T ln\{(R_2/R_1)(I_{S2}/I_{S1})\}=V_{BE1}+KV_T \quad (8)$$

where $V_{BE1}$ is the base-emitter voltage of the transistor $Q_1$, and K is a constant.

Thus, since the base-emitter voltage $V_{BE1}$ of the transistor $Q_1$ having a temperature dependent property and $KV_T$ having an inverted characteristics are added, the value of the constant K is determined by the ratios $(R_2/R_1)$, $(R_2/R_3)$ and $(I_{S2}/I_{S1})$ to produce a constant voltage irrespective of a change in the temperature.

Figure 5:
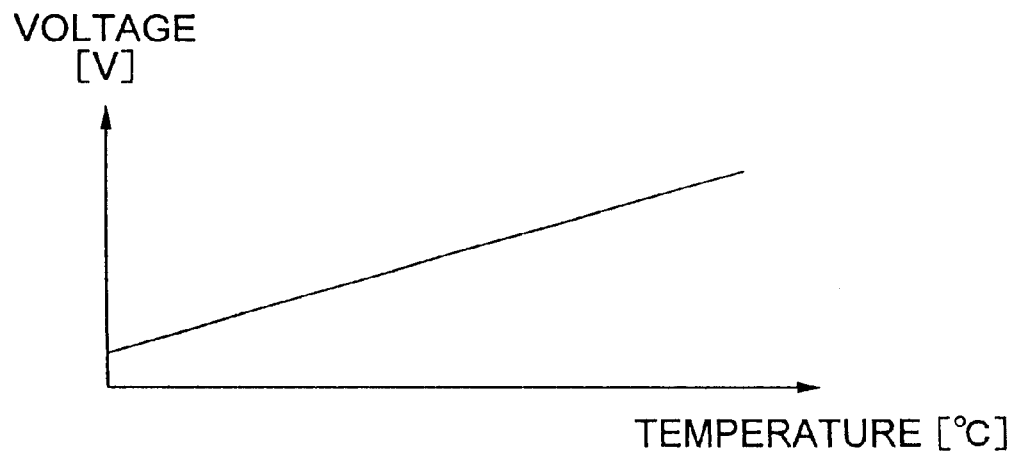
FIG. 5 is a diagram of an output waveform from a temperature detection circuit of FIG. 1.

Since the difference $\Delta V_{BE}$ between the base-emitter voltages $V_{BE}$ of the transistors $Q_2$ and $Q_1$ of the set forth band gap reference voltage circuit changes linearly depending on temperature, the temperature detection circuit 1 uses the base-emitter voltage difference $\Delta V_{BE}$. Thus, a sensed temperature value is output which comprises an analog voltage value increasing linearly depending on temperature, as shown in FIG. 5, without using a thermistor whose resistance changes linearly depending on temperature.

Figure 6:
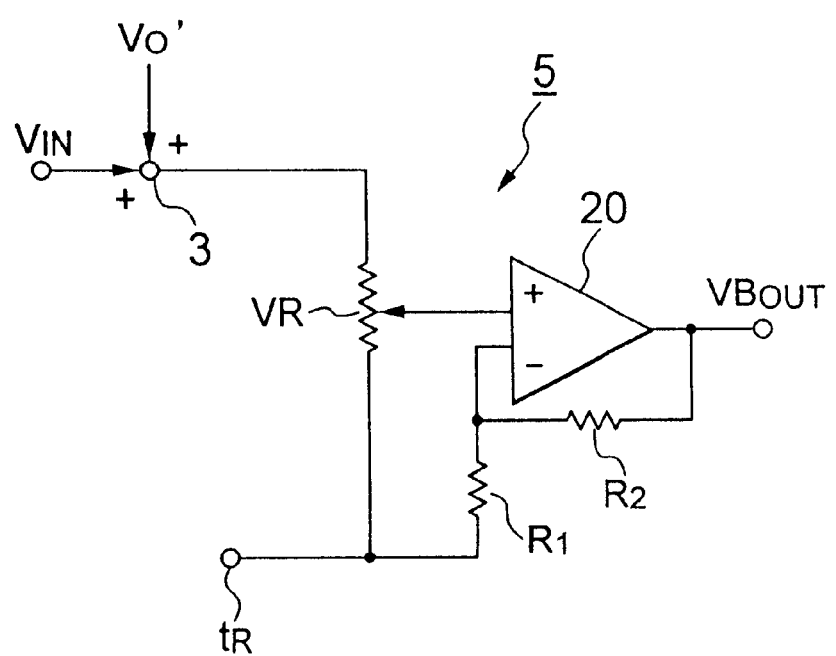
FIG. 6 is a circuit diagram of one example of a first-order component generation unit of FIG. 1.

As shown in FIG. 6, the first-order component generation unit 5 is comprised of a variable resistor VR connected across the adder 3 and a reference fixed voltage input terminal $t_R$, a non-inverting amplifier 20 having a non-inverting input connected to a slider of the variable resistor VR and having an inverting input connected to the reference fixed voltage input terminal $t_R$ via a resistor $R_1$, with the output signal from the amplifier 20 being fed back to its inverting input and with the referent fixed voltage input terminal $t_R$ being supplied with the reference fixed voltage $V_{REFM}$ from the third-order component generation circuit 8.

According to the first-order component generating unit 5, the non-inverting amplifier 20 amplifies the difference between the input signal $V_{In}$ and the differential between the reference fixed voltage $V_{REFM}$ and the variable voltage $V_0'$ to provide an output voltage $VB_{OUT}$ represented by:

$$VB_{OUT}=b_1(V_{In}-V_0)+V_{REFM} \quad (9)$$

where $V_0=V_{REFM}-V_0'$, and the variable $b_1$ is determined by a set value of the variable resistor VR and the gain of the non-inverting amplifier 20.

Operation of the embodiment will be described next.

First, operation of the approximate third-order function generator 2 will be described.

Figure 7:
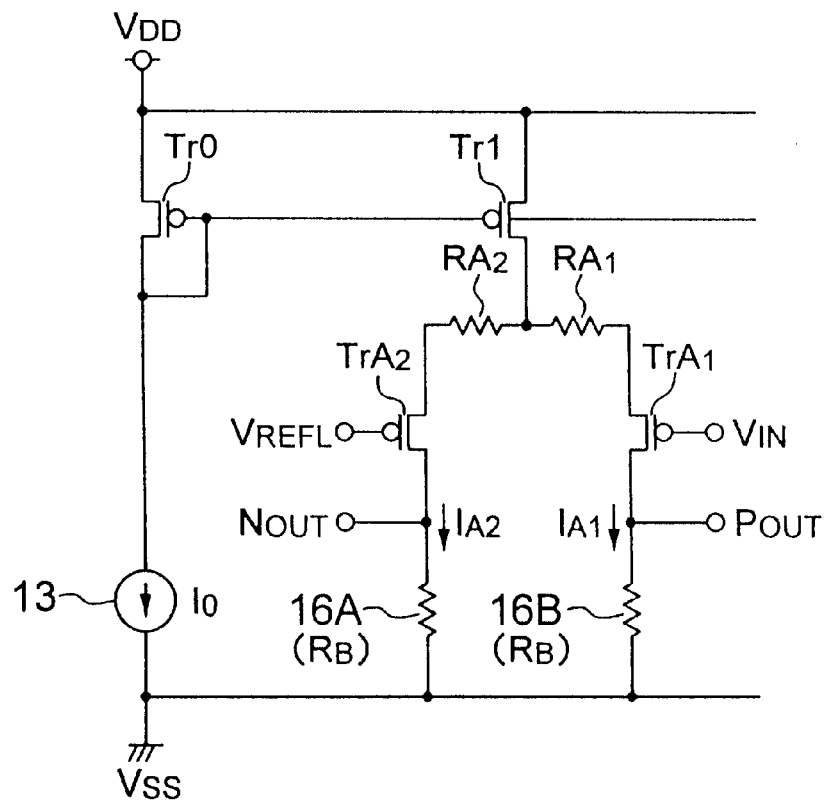
FIG. 7 is a basic circuit diagram used for explaining operation of the third-order generation circuit of FIG. 3.

In order to simplify the explanation of the operation of the third-order component generation circuit 8, one differential amplifier 15A will be described as an example, as shown in FIG. 7. When the input voltage $V_{In}$ is sufficiently low compared to the reference voltage $V_{REFL}$, the whole current which flows through the transistor Tr 1 also flows through the transistor $TrA_1$. Let a constant current value of the current mirror circuit 14 be $I_0$. In this case, a current $I_{A1}$ which flows through the transistor $TrA_1$ becomes $I_0$ and a current $I_{A2}$ which flows through the transistor $TrA_2$ becomes zero. Thus, the output voltages $P_{OUT}$ and $N_{OUT}$ at the output terminals $t_P$ and $t_N$ are $I_0 R_R$ and zero, as shown in broken and solid lines, respectively, in FIG. 8 where $R_B$ is the resistance value of each of the resistors 16A and 16B.

When the input voltage $V_{In}$ increases from this state and exceeds a value $V_{AL}$ which represents the reference fixed voltage $V_{REFL}$ minus a voltage drop $I_0 \cdot R_A$ across the resister $RA_1$, the output voltage $P_{OUT}$ gradually decreases smoothly. In contrast, when the output voltage $N_{OUT}$ gradually increases smoothly and the input voltage $V_{IN}$ equals the reference fixed voltage $V_{REFL}$, the output voltage $P_{OUT}$ equals the output voltage $N_{OUT}$. When the input voltage $V_{IN}$ further increases, the output voltage $P_{OUT}$ maintains its decreasing tendency, and the output voltage $N_{OUT}$ maintains its increasing tendency. When the input voltage $V_{IN}$ exceeds a value $V_{AH}$ which includes the sum of the reference fixed voltage $V_{REFL}$ and the voltage drop $I_0 \cdot R_A$ across the resistor $RA_2$, the output voltage $P_{OUT}$ becomes zero whereas, conversely, the output voltage $N_{OUT}$ becomes $I_0 \cdot R_B$.

Figure 8:
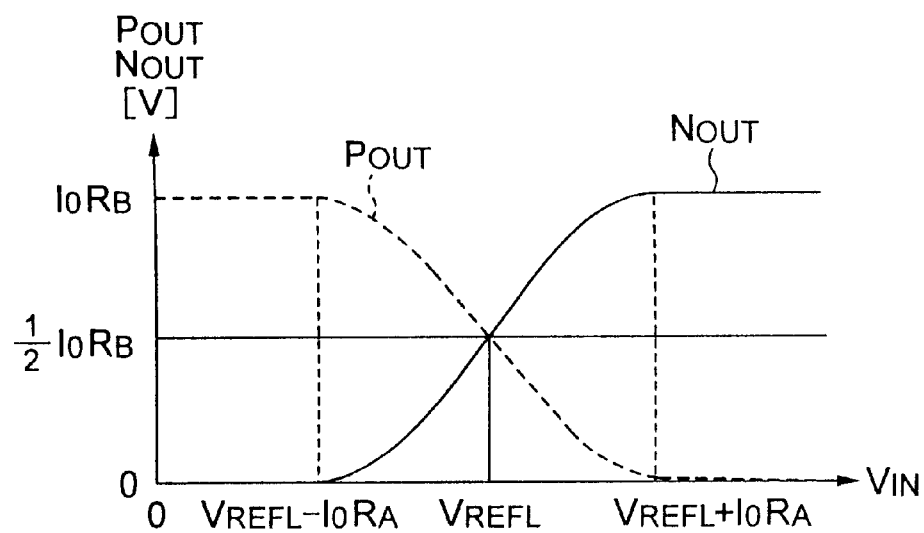
FIG. 8 is an output waveform diagram of FIG. 7.

Eventually, in the output characteristics of FIG. 8, it is smooth output changes in the vicinity of $V_{REFL} \pm I_0 R_A$ that is determined only by the resistance values $R_A$ of the resistors $RA_1$ and $RA_2$ and the constant current value $I_0$ of the current mirror circuit 10, depending on the characteristics of the transistors.

Figure 9:
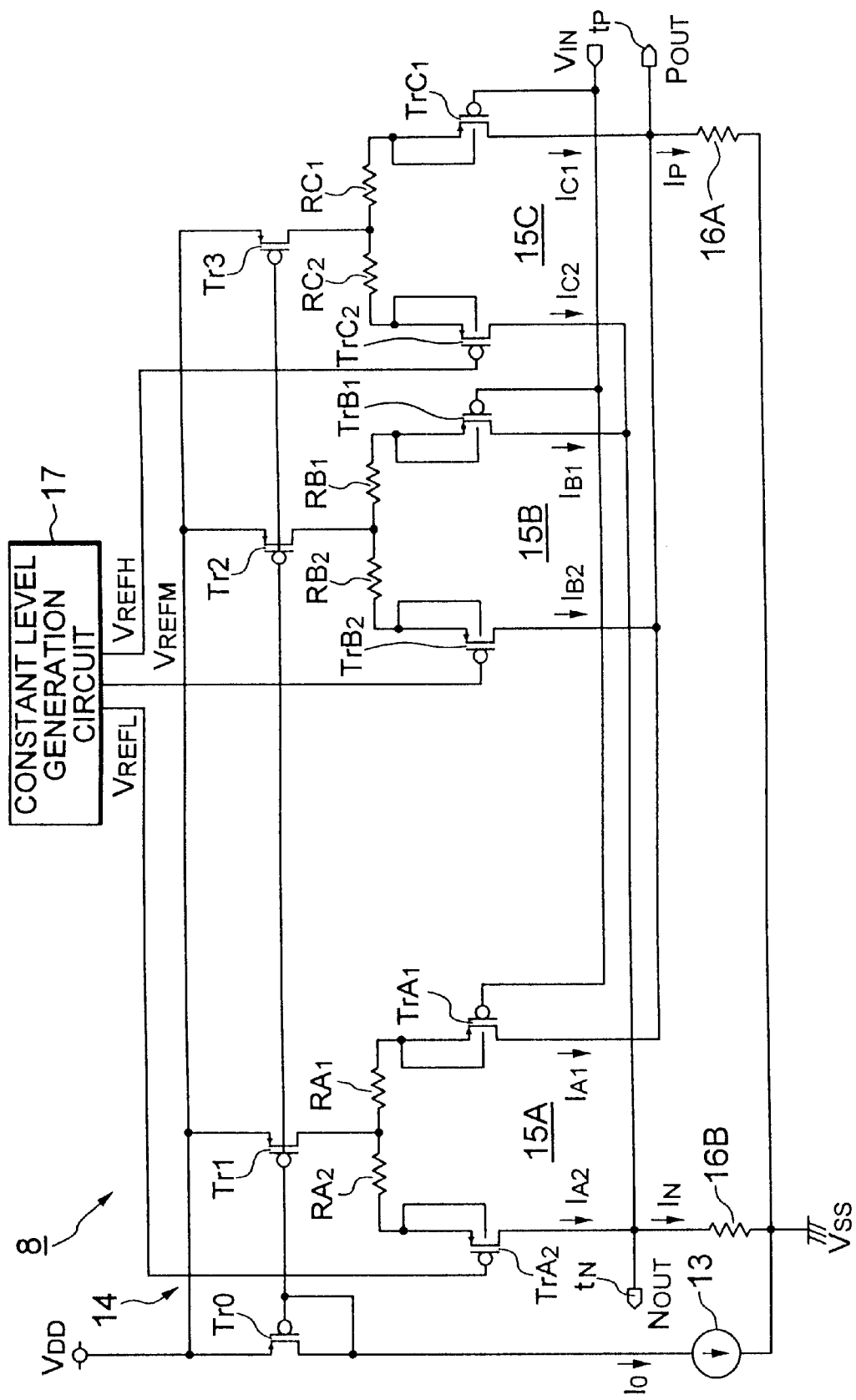
FIG. 9 is a circuit diagram of a basic third-order component generation unit of the third-order component generation circuit of FIG. 3.

Now, a circuit of FIG. 9 which is obtained by eliminating the fourth differential amplifier 15D from the third-order component generation circuit 8 of FIG. 3 is considered. When the input voltage $V_{IN}$ is sufficiently low compared to the reference fixed voltage $V_{REFL}$ ($V_{IN} << V_{REFH}$), the whole current which flows through the transistor Tr1 in the differential amplifier 15A flows through the transistor $TrA_1$, as mentioned above. As a result, $I_{A1}=I_0$, and $I_{A2}=0$. Similarly, also in the differential amplifiers 15B and 15C, $I_{B1}=I_{C1}=I_0$, and $I_{B2}=I_{C2}=0$. The currents $I_P$ and $I_N$ which flow through the resistors 16A and 16B which constitute the respective adders become $I_P=2I_0$ and $I_P=I_0$.

When the input voltage $V_{IN}$ increases, a current starts to flow through the transistor $TrA_2$ whereas the current which flows through the transistor $TrA_1$ starts to decrease until the input voltage $V_{IN}$ reaches the reference fixed voltage $V_{REFL}$, at which time $I_{A1}=I_{A2}=I_0/2$. No other differential amplifiers 15B and 15C change their states, so that the output currents $I_N$ and $I_P$ become $I_N=I_P=3I_0/2$. When the input voltage $V_{IN}$ further increases, $I_{A1}=0$, and $I_{A2}=I_0$. Thus, the output currents $I_P$ and $I_N$ become $I_P=I_0$, and $I_N=2I_0$.

When the input voltage $V_{IN}$ further increases, a current starts to flow through the transistor $TrB_2$ of the differential amplifier 15B, and the current flowing through the transistor $TrB_1$ starts to decrease until the input voltage $V_{IN}$ reaches the reference fixed voltage $V_{REFM}$, at which time $I_{B1}=I_{B2}=I_0 2$, and the output currents $I_P$ and $I_N$ again become $I_N=I_P=3I_0/2$.

When the input voltage $V_{IN}$ further increases appropriately, $I_P=I_0$, and $I_N=2I_0$. Then, when the input voltage $V_{IN}$ reaches the reference fixed voltage $V_{REFH}$, the output voltage $I_P$ and $I_N$ again become $I_P=I_N=3I_0 2$. Then, when the input voltage $V_{IN}$ further increases appropriately, $I_P=2I_0$, and $I_N=I_0$.

Figure 10:
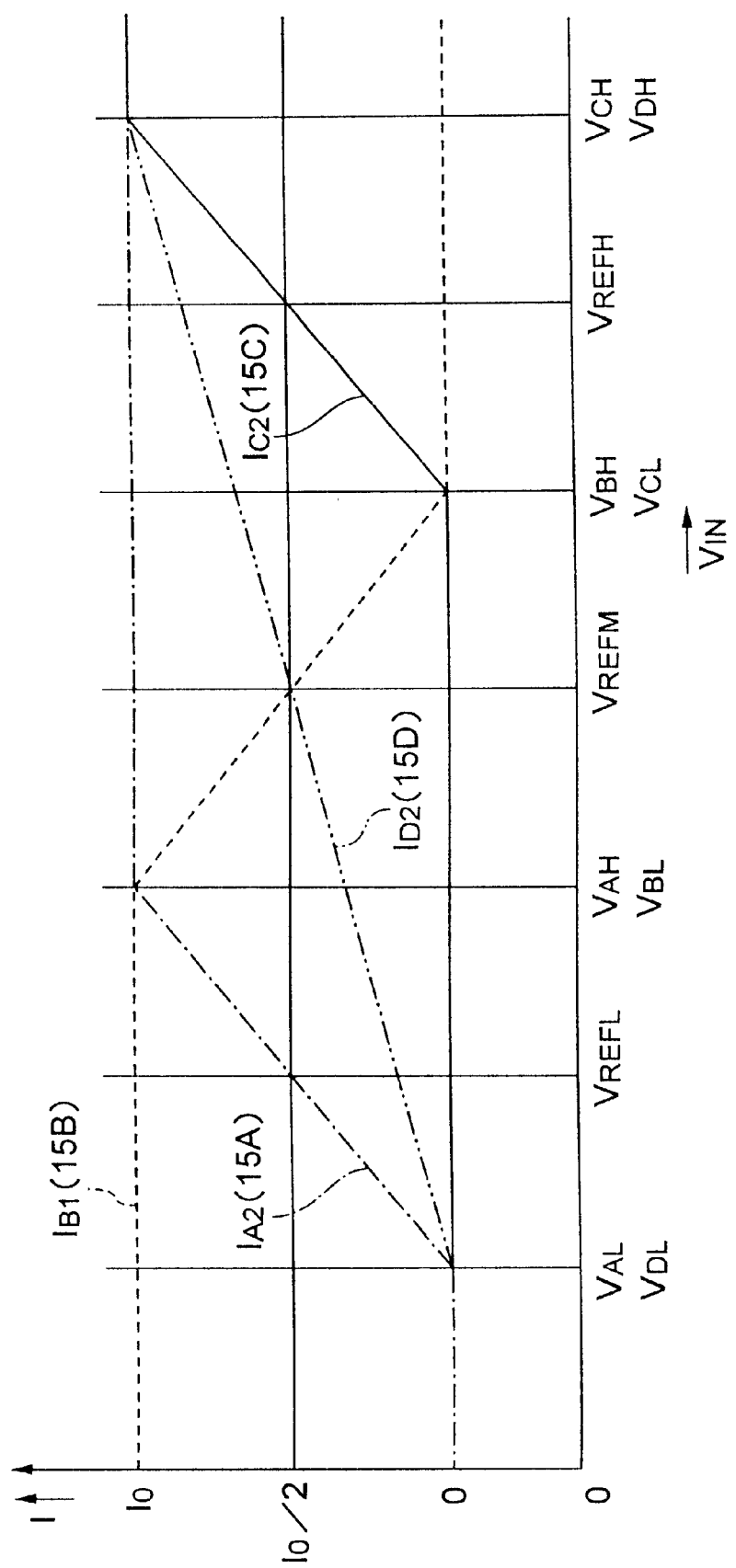
FIG. 10 is a characteristics curve diagram of inverted output characteristics of the respective differential amplifiers used for explaining operation of the third-order component generation circuit of FIG. 3.

Thus, for example, as for the inverting terminal $t_N$ side, the output current $I_{A2}$ of the first differential amplifier 15A, as shown by a dot-dashed line in FIG. 10, maintains zero until the input signal voltage $V_{IN}$ reaches a minimum value $V_{AL}$ in the first differential amplifier 15A. When the input signal voltage $V_{IN}$ exceeds the minimum value $V_{AL}$, the output current $I_{A2}$ of the first differential amplifier 15A starts to increase until the input signal voltage reaches the reference fixed voltage $V_{REFL}$, at which time, the output current becomes $I_0/2$. Also, thereafter, the output current increases depending on an increase in the voltage of the input signal $V_{IN}$ until it reaches $I_0$ at a maximum value $V_{AH}$ of the input signal voltage to become saturated.

The output current $I_{B1}$ from the second differential amplifier 15B, as shown by broken lines in FIG. 10, maintains $I_0$ until the voltage of the input signal $V_{IN}$ reaches the minimum value $V_{BL}$ (in the present embodiment, set to a value equal to $V_{AH}$) in the second differential amplifier 15B. When the voltage of the input signal $V_{IN}$ exceeds the minimum value $V_{BL}$, the output current $I_{A1}$ from the second differential amplifier 15B decreases as the voltage of the input signal $V_{IN}$ increases until the voltage of the input signal $V_{IN}$ reaches the reference fixed voltage $V_{REFM}$, at which time the output current $I_{A1}$ becomes $I_0/2$. Thereafter, as the voltage of the input signal $V_{IN}$ increases, the output current $I^{A1}$ decreases, and then maintains zero when the voltage of the input signal $V_{IN}$ exceeds the maximum value $V_{BH}$.

The output current $I_{C2}$ from the third differential amplifier 15C, as shown by a dot-dashed line in FIG. 10, maintains zero until the voltage of the input signal voltage $V_{IN}$ reaches a minimum value $V_{CL}$ in the third differential amplifier 15C (which is set at a value equal to $V_{BH}$ in the particular embodiment). When the input signal voltage $V_{IN}$ exceeds the minimum value $V_{CL}$, the output current $I_{C2}$ from the first differential amplifier 15C starts to increase until the input signal voltage reaches the reference fixed voltage $V_{REFH}$, at which time the output current becomes $I_0/2$. Also, thereafter, the output current increases depending on an increase in the voltage of the input signal $V_{IN}$ until it reaches $I_0$ corresponding to a maxim value $V_{CH}$ of the input signal voltage to become saturated.

Thus, the output voltages $P_{OUT}$ and $N_{OUT}$ at the output terminals $t_P$ and $t_N$ are represented as $P_{OUT}=I_P \cdot R_B$, and $N_{OUT} \cdot R_B$ and the currents $I_P$ and $I_N$ flowing through those resistors by the resistors 16A and 16B. By adjusting the circuit constants, a smooth third-order curve is obtained which is shown by a broken-line characteristics curve $L_1$ in FIG. 11.

Figure 11:
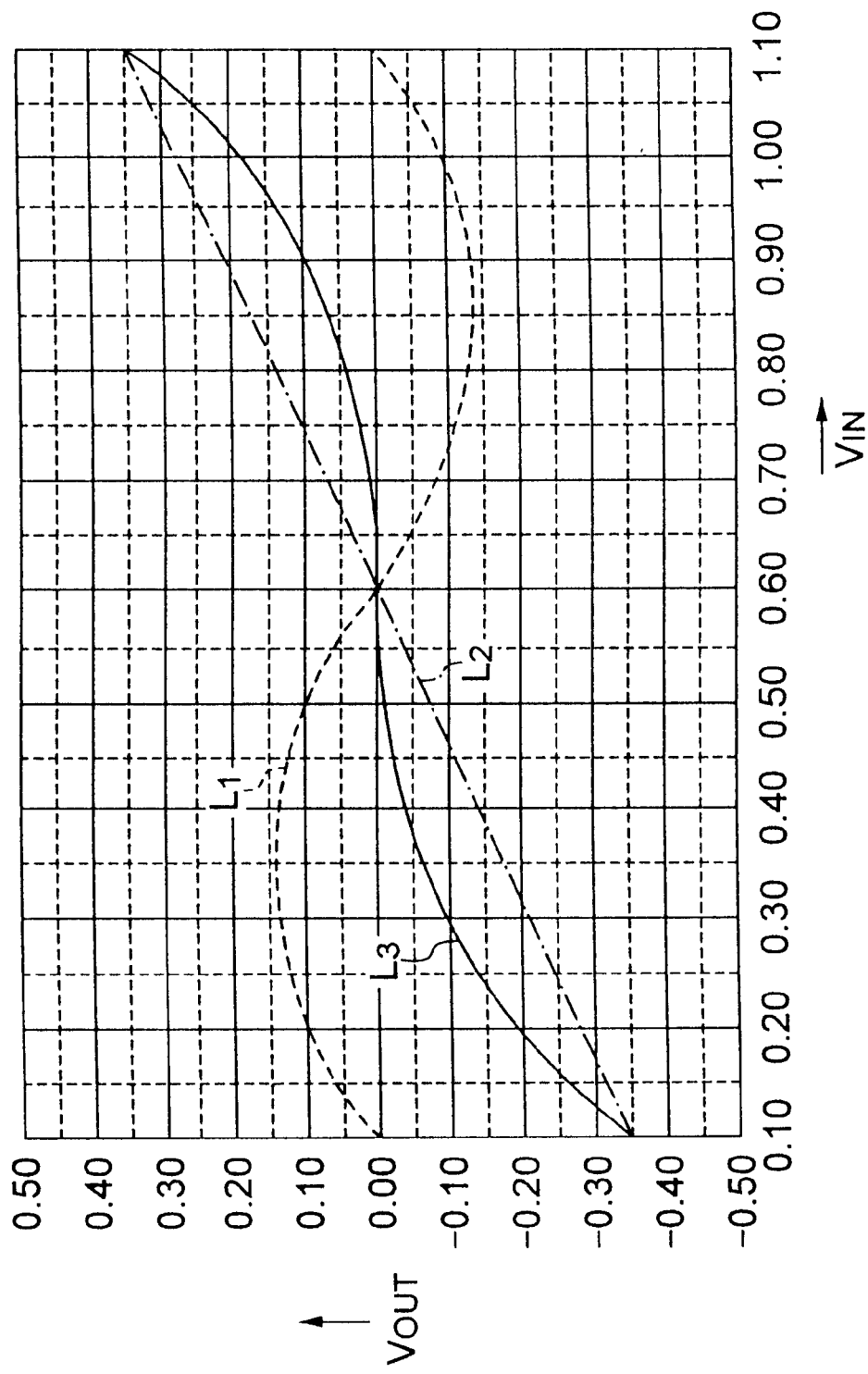
FIG. 11 is an output waveform diagram used for explaining operation of the third-order component generation circuit of FIG. 3.

The characteristics curve $L_1$ of FIG. 11 includes the sum of the third-order function and a linear function having a negative inclination, which does not represent only the third-order component of the first term of the expression (2).

Thus, in the present embodiment, the fourth differential amplifier 15D is additionally provided to generate a linear function having a positive inclination which offsets the. linear function having the negative inclination.

Figure 12:
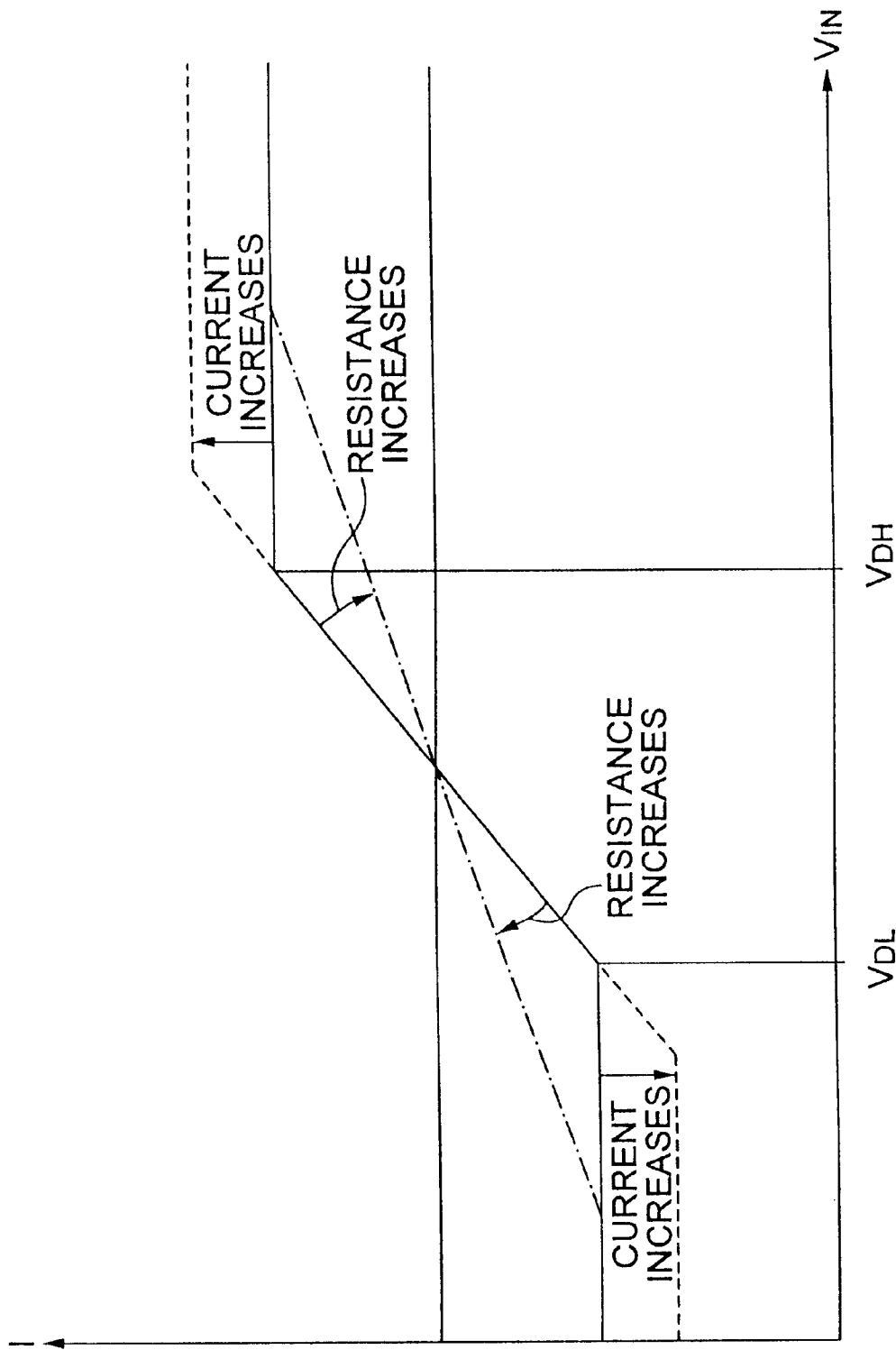
FIG. 12 is a waveform diagram of an input-output characteristics of a fourth differential amplifier of FIG. 3.

The fourth differential amplifier 15D has a composition similar to those of the first and third differential amplifiers 15A and 15C, so that in its input/output characteristics of FIG. 12, the inclination of an area approximate to the linear function is reduced by increasing the resistance values of the resistors $RD_1$ and $RD_2$ and that the distance between the minimum value $V_{DL}$ and the maximum value $V_{DH}$ and hence the area approximate to the linear function are increased. Also, by increasing the values of the currents fed to the resitors $RD_1$ and $RD_2$, the area approximate to the liner function can be increased.

Thus, by adjusting the resistance values $R_D$ of the resistors $RD_1$ and $RD_2$ of the fourth differential amplifier 15D and the values of the currents fed to the resistors $RD_1$ and $RD_2$ to change the input-output characteristics of the amplifier 15D so that the minimum value $V_{DL}$ and the maximum value $V_{DR}$ coincide with the minimum value $V_{AL}$ of the first differential amplifier 15A and the maximum value $V_{CH}$ of the third differential amplifier 15C, respectively, as shown by a dot-dot dashed line in FIG. 10, an input/output characteristics is obtained which is represented by an approximate linear characteristics curve $L_2$ as shown by a dot-dash line in FIG. 11. By adding the characteristics curve $L_2$ to the characteristics curve $L_1$, only a third-order component is obtained which is free form the linear function component, as shown by a solid-line characteristics curve $L_3$ in FIG. 11.

By supplying the non-inverted output signal $P_{OUT}$ and inverted output signal $N_{OUT}$ of the third-order component generation circuit 8 via the buffer circuits 9 and 10, respectively, to the differential amplifier 11, which, in turn, supplies its output signal to the variable gain amplifier 12, and by supplying an offset voltage $V_{OFF}$ from the constant voltage circuit 18 to the non-inverting inputs of the differential amplifier 11 and the variable gain amplifier 12, an output voltage $VA_{OUT}$ which includes only the third-order component and constant component free from the first-order component, as represented by the expression (5), is obtained from the variable gain amplifier 12.

Figure 13:
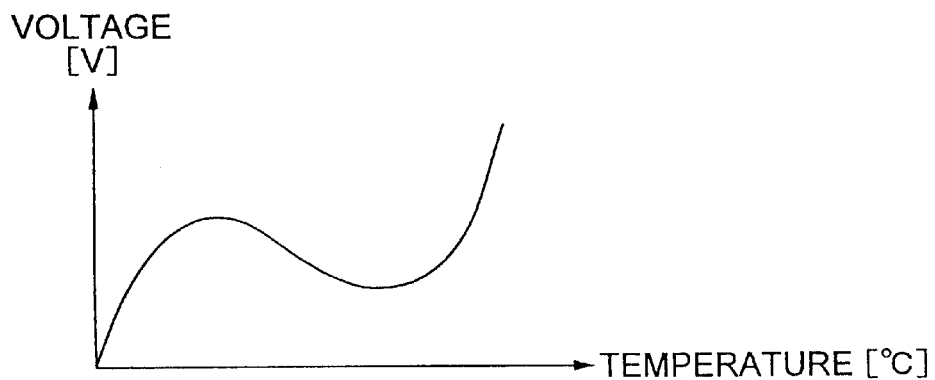
FIG. 13 is an output waveform diagram used for explaining operation of the third-order function generator of FIG. 1.

The first-order component generation unit 5 provides an output voltage $VB_{OUT}$ which includes only the first-order component and constant component represented by the expression (6). Thus, by adding the output voltage $VB_{OUT}$ to the output voltage $VA_{OUT}$ of the third-order component generation unit 4 in the addition circuit 7, an approximate third-order function is generated which is represented by:

$$V_{OUT}=b_3'(V_{IN}-V_0)^3+b_1'(V_{IN}-V_0)+b_0' \tag{10}$$

where $V_0$ can be set at any value by adjusting the variable voltage $V_0'$. The third-order component variable $b_3'$ is adjustable with copy by adjusting the gains of the third-order component generation circuit 8 and the variable gain amplifier 12, as described above. The first-order component variable $b_1'$ is adjustable by adjusting the resistance value of the variable resistor VR and the gain of the non-inverting amplifier 20 of the first-order component generation unit 5. A constant $b_0'$ is adjustable by an offset voltage $V_{OFF}$ set in the constant voltage circuit 18. The respective variables are adjustable independently to generate any third-order function such as is shown in FIG. 13.

The current mirror circuit 10 and the differential amplifiers 15A–15D of the third-order component generation circuit 8 can be all composed of CMOS transistors to thereby achieve higher integration and lower power consumption.

Figure 14:
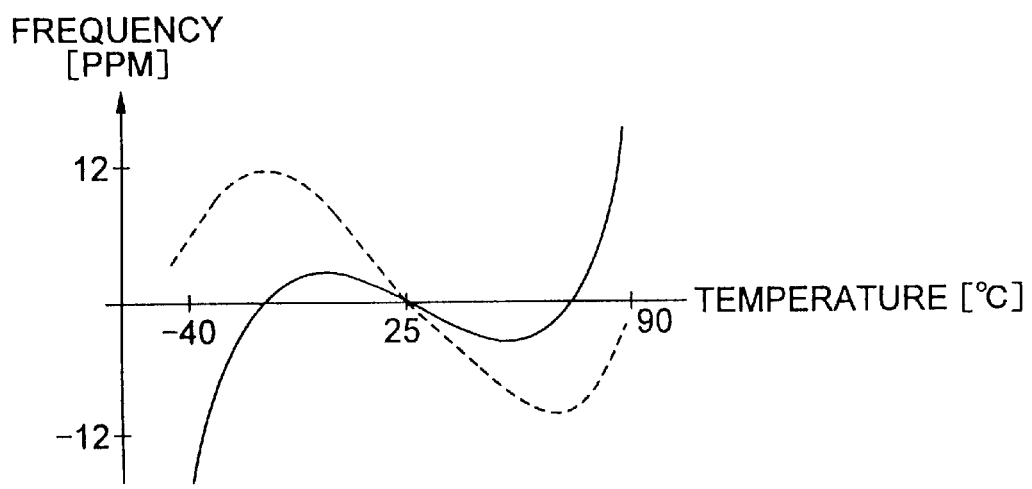
FIG. 14 is a temperature characteristics diagram of a crystal resonator.
Figure 15:
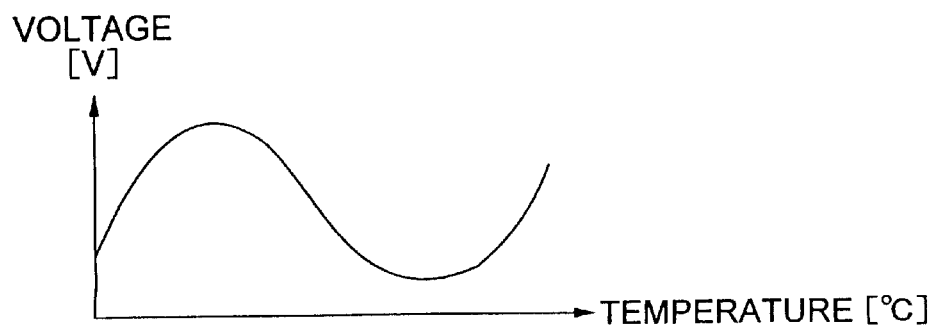
FIG. 15 is an output waveform diagram of a prior-art third-order function generator.

By applying the present invention to the temperature compensated crystal oscillator as in the embodiment, the crystal resonator included in the voltage-controlled crystal oscillation circuit 3 has a general oscillation frequency-temperature characteristics such as shown in FIG. 14 where the horizontal axis represents temperature (° C.) and the vertical axis frequency (ppm). The temperature characteristics is approximated by:

$$Y=\alpha \times (t-t_0)^3+\beta \times (t-t_0)+\gamma \tag{11}$$

where Y is the output frequency, $\alpha$ is a third-order coefficient, $\beta$ is a inclination of the temperature characteristics, $\gamma$ is a frequency offset, t is a atmospheric temperature, and $t_0$ is a temperature at the center of the curve Y (usually, in an arrange of 25–30° C.).

The coefficients and constant $\alpha$, $\beta$ and $\gamma$ in the expression (11) are dependent on the characteristics of the crystal resonator and the voltage-controlled crystal oscillation circuit 8, especially greatly on the crystal resonator, and more particularly, on its shape and size.

The voltage-frequency characteristics of the voltage-controlled crystal oscillation circuit 8 used widely at present can be approximated by a linear function, so that temperature-frequency characteristics of the crystal resonator is realized by its temperature-voltage characteristics.

Thus, in the embodiment of FIG. 1, voltages corresponding to the first, second and third terms of the right side of the expression (11) are generated by the approximate third-order curve generator 2 on the basis of a detected temperature signal from the temperature detection circuit 1; where there are possible deviations between solids in the third-order term coefficient α, temperature characteristics inclination β, and frequency offset γ of the generator 2 from their standard values, these are respectively adjusted finely by adjusting the gain of the third-order component generation circuit 8 and/or the gain of the variable gain amplifier 12 and the output voltage $V_{OFF}$ of the constant voltage circuit 18 of the third-order component generation unit 4, and/or the resistance value of the variable resistor VR and/or the gain of the non-inverted amplifier 20 of the first-order component generation unit 5; the respective voltages obtained after the fine adjustments are added in the addition circuit 7 to obtain a control voltage for the voltage-controlled crystal oscillation circuit 8 corresponding to the temperature-frequency characteristics of the crystal resonator of FIG. 14; the control voltage is then supplied to the voltage-controlled crystal oscillation circuit 8 to accurately compensate the temperature dependant characteristics of the crystal resonator included in the oscillation circuit 8.

Specifically, the approximate third-order function generator 2 and the voltage-controlled crystal oscillator (VCXO) 100 of FIG. 1 are separately placed within the respective constant temperature tanks, whose temperatures are set at any respective particular temperatures in a range of temperatures in which the temperature compensation is desired.

In a state where the tank temperatures are stabilized at their set temperatures, the input voltage $V_{Cin}$ to the voltage-controlled crystal oscillator 100 is changed, so that the input voltage $V_{Cin1}$ where the frequency of the output signal coincides with the preset frequency is measured, and the output voltages $V_{Cout1}$ from the temperature compensation circuit comprised of the temperature detection circuit 1 and the third-order function generator 2 is measured.

The above measurements are repeated twice or more, preferably four times or more, by raising the set temperatures of said tanks sequentially to different higher temperatures, so that the input voltages $V_{Cin1}$-$V_{CinN}$ to the voltage-controlled crystal oscillator 100 and the output voltage $V_{CoutN}$ of the third-order function generator 2 are obtained at the respective set temperatures.

Then, the respective measured input voltages $V_{Cin1}$-$V_{CinN}$ and output voltages $V_{Cout1}$-$V_{CoutN}$ are approximated, respectively, as functions of temperature by:

$$V_{Cin}(T) = \alpha_3(T-T_0)^3 + \alpha_1(T-T_0) + \alpha_0 \quad (12)$$

$$V_{Cout}(T) = \beta_3(T-T_0')^3 + \beta_1(T-T_0') + \beta_0 \quad (13)$$

where $\alpha_3$, $\alpha_1$ and $\alpha_0$ of the expression (12) correspond to α,β and γ of the expression (11), and are dependent on the crystal resonator concerned.

By adjusting $\beta_3$, $\beta_1$, $\beta_0$ and $T_0'$ in the approximate third-order function generator 2 to be $\beta_3=\alpha_3$, $\beta_1=\alpha_1$, $\beta_0=\alpha_0$ and $T_0'=T_0$, high-accuracy temperature compensation is achieved only by a single temperature sweeping operation.

The approximate third-order function generator 2 is specifically adjusted as follow: The central temperature $T_0'$ of the third-order function curve of the expression (13) is adjusted by a variable voltage $V_0'$ applied to the addition circuit 3 of FIG. 1. The constant $\beta_0$ is adjusted by an offset voltage $V_{OFF}$ output from the constant voltage generation circuit 18 of FIG. 2. The first-order, term coefficient $\beta_1$ is adjusted by the variable resistor VR of the first-order component generation unit 5 of FIG. 6. The third-order term coefficient $\beta_3$ is adjusted by the variable resistor 12a of the variable gain amplifier 12 of FIG. 2 in the third-order component and constant component generation unit 4.

Thus, by raising the tank temperatures sequentially to four or more different temperatures, the output voltage from the temperature compensation circuit, i.e. the output voltage $V_{Cout}$ from the approximate third-order function generator 2 and the input voltage $V_{Cin}$ to the voltage-controlled crystal oscillation circuit 100 are respectively measured at the respective temperatures, the approximate third-order function generator 2 is adjusted on the basis of-the results of those measurements. That is, high-accuracy temperature compensation is achieved by a single temperature sweeping operation.

According to the embodiment, the temperature detection circuit 1 and the approximate third-order function generator 2 are constructed by a band gap reference voltage circuit which has an analog circuit composition using bipolar transistors, and the approximate third-order curve generation circuit 2 is constructed by an analog circuit which includes the current mirror circuit 14, differential amplifiers 15A–15D and resistors 16A and 16B, and hence all the components excluding the crystal resonator are integrated.

While in the embodiment the third-order component generation unit 4 has been illustrated as using p-channel MOS field effect transistors, the present invention is not limited to this particular case. For example, the third-order component generation circuit 8 may include n-channel MOS field effect transistors or otherwise bipolar transistors instead of the field effect transistors to produce beneficial effects similar to those mentioned above.

While in the embodiment the third-order component and constant component generation circuit 4 has been illustrated as generating the third-order components and constant components, the present invention is not limited to this particular case. For example, arrangement may be such that by removing the constant voltage generation circuit 18 from the third-order component and constant component generation unit 4, only the third-order component is output; the output from the constant voltage generation circuit 18 is supplied to a constant-component generation unit having a structure similar to that of the first-order component generation unit 5 of FIG. 6; the output voltage from the constant component generation unit, the output signal from the third-order component generation circuit and the output signal from the first-order component generation unit 5 are added in the addition circuit 7; and the resulting signal is then supplied to the voltage-controlled crystal oscillator 8.

While in the embodiment the voltage-controlled crystal oscillation circuit 8 has been described which includes the crystal resonator and the C-MOS inverter connected in series, the present invention is not limited to this particular case. For example, the crystal resonator and the C-MOS inverter may be connected in parallel to constitute a voltage-controlled crystal oscillation circuit. Alternatively, a voltage-controlled crystal oscillation circuit which includes transistors instead of the C-MOS inverter may be used.

The circuit composition of the third-order component generation circuit 8 and others in the embodiment may employ a current reference system instead of the voltage reference, and further employ a ground reference system using n-channel MOSFETs instead of the $V_{DD}$ reference using the p-channel MOSFETs.

What is claimed is:

1. An approximate third-order function generator, comprising:
   a first amplifier, a second amplifier and a third amplifier, each receiving a common input signal and a different fixed level signal, the three different fixed level signals received respectively by the first, second and third amplifiers sequentially increasing in level in this order, each amplifier having an input-output characteristics in which a non-inverted or inverted output signal is provided based on the common input signal and the fixed level signal concerned, that amplifier also having a function to limit the output signal to within a range defined by a maximum predetermined value and a minimum predetermined value;
   a fourth amplifier receiving the common input signal and the same fixed level signal as said second amplifier receives, said fourth amplifier having input-output characteristics in which a non-inverted or inverted output signal is provided based on the common input signal and the fixed level signal concerned, and having a function to limit the output signal to within a range defined by an maximum predetermined value and a minimum predetermined value; and
   a fixed level signal generation circuit for supplying the fixed level signals having the different fixed levels to said first, second, third, and fourth amplifiers, respectively, the output characteristics of said first, third and fourth amplifiers being set so as to have a same polarity, the output characteristics of the second amplifier being set so as to be inverted to those of said first, third, and fourth amplifiers, wherein the output signals from said first, second, third and fourth amplifiers being added to generate a third-order function component free from a first-order component.

2. An approximate third-order function generator, comprising:
   a third-order component generation unit which includes a third-order component generation circuit of claim 1 supplied with an input added voltage as a first-order input voltage which includes the sum of a first-order input voltage signal and a variable voltage signal, and a variable gain amplifier which receives an amplified version of a differential between the non-inverted and inverted output signals from said third-order component generation circuit;
   a first-order component generation unit for receiving the input added input voltage and for generating a first-order component;
   a constant generation unit for receiving a constant voltage signal and for generating a constant component; and
   an addition circuit for adding output signals from said third-order component generation unit, said first-order generation unit, and said constant generation unit.

3. An approximate third-order function generator according to claim 1 or 2, wherein said fourth amplifier has an output characteristics reverse in inclination to the reverse output characteristics of said second amplifier, and the distance between the maximum and minimum values of the output signal is set so as to be longer than that of said second amplifier.

4. An approximate third-order function generator according to claim 1, wherein the first, second, third, and fourth amplifiers each comprises a differential amplifier having a pair of MOS field effects transistors.

5. A temperature compensated crystal oscillation circuit, comprising:
   a temperature detection circuit, an approximate third-order function generator for receiving a detection signal from said temperature detection circuit, and a voltage-controlled crystal oscillation circuit for receiving an approximate third-order function generated by said approximate third-order function generator;
   wherein said approximate third-order function generator comprises a first amplifier, a second amplifier and a third amplifier, each for receiving a common input signal and a different fixed level signal, the three different fixed level signals received respectively by the first, second and third amplifiers sequentially increasing in level in such order, each amplifier having input-output characteristics in which a non-inverted or inverted output signal is provided and based on the common input signal and the respective fixed level signal such amplifier also having a function to limit the output signal to within a range defined by a maximum predetermined value and a minimum predetermined value;
   a fourth amplifier for receiving the common input signal and the same fixed level signal as said second amplifier receives, said fourth amplifier having input-output characteristics in which a non-inverted or inverted output signal is provided based on the common input signal and the respective fixed level signal, and having a function to limit the output signal to within a range defined by a maximum predetermined value and a minimum predetermined value; and
   a fixed level signal generation circuit for supplying the fixed level signals having the different fixed levels to said first, second, third, and fourth amplifiers, respectively, the output characteristics of said first, third, and fourth amplifiers being set so as to have a same polarity, the output characteristics of the second amplifier being set so as to be inverted to those of said first, third and fourth amplifiers, wherein the output signals from said first, second, third, and fourth amplifiers being added to generate a third-order function component free from a first-order component.

6. A temperature compensation adjusting method for a temperature compensated crystal oscillation circuit, comprising the steps of:
   measuring an output voltage $V_{Cout}$ from a temperature compensation circuit in a predetermined temperature atmosphere;
   measuring an input voltage $V_{Cin}$ to said a voltage-controlled crystal oscillation circuit where an oscillation frequency output from said voltage-controlled crystal oscillation circuit coincides with a preset selected frequency at a respective one of a plurality of temperatures T in a desired temperature compensation range;
   approximately representing the measured input voltage $V_{Cin}$ and output voltage $V_{Cout}$ at a respective temperature by:

$$V_{Cin}(T) = \alpha_3(T-T_0)^3 + \alpha_1(T-T_0) + \alpha_0$$

$$V_{Cout}(T) = \beta_3(T-T_0')^3 + \beta_1(T-T_0') + \beta_0;$$

adjusting coefficients $\beta_0$, $\beta_1$, $\beta_3$ and $T_0'$ of the temperature compensation circuit so as to coincide with the coefficients $\alpha_0$, $\alpha_1$, $\alpha_3$, and $T_0$, respectively, inherent to a crystal resonator of the voltage-controlled crystal oscillation circuit.

7. An approximate third-order function generator, comprising:

a third-order component generation unit in which a third-order component generation circuit as set forth in claim 5 is supplied with an input added voltage as a first-order input voltage which includes the sum of a first-order input voltage signal and a variable voltage signal, and a variable gain amplifier which receives an amplified version of the differential between the non-inverted and inverted output signals from said third-order component generation circuit;

first-order component generation unit for receiving the input added input voltage and for generating a first-order component;

a constant generation unit for receiving a constant voltage signal and for generating a constant component; and an addition circuit for adding output signals from said third-order component generation unit, said first-order generation unit, and said constant generation unit.

8. An approximate third-order function generator according to claim 5 or 7, wherein said fourth amplifier has output characteristics reverse in inclination to the reverse output characteristics of said second amplifier, and the distance between the maximum and minimum values of the output signal is set so as to be longer than that of said second amplifier.

* * * * *

UNITED STATES PATENT AND TRADEMARK OFFICE
CERTIFICATE OF CORRECTION

PATENT NO. : 6,584,380 B1
DATED : June 24, 2003
INVENTOR(S) : Kenji Nemoto

It is certified that error appears in the above-identified patent and that said Letters Patent is hereby corrected as shown below:

Column 15,
Line 11, "having an input-output" should read -- having input-output --.

Column 15,
Line 24, "an maximum" should read -- a maximum --.
Lines 58-59, "has an output" should read -- has output --.
Line 67, "effects" should read -- effect --.

Column 16,
Line 20, "signal such" should read -- signal, such --.
Line 47, "$V_{Count}$" should read -- $V_{Cout}$ --.
Line 50, "to said a" should read -- to a --.
Line 64, "$\beta 3$" should read -- $\beta_3$ --.

Column 17,
Line 12, "first-order" should read -- a first order --.

Signed and Sealed this

Ninth Day of December, 2003

JAMES E. ROGAN
*Director of the United States Patent and Trademark Office*